US008169132B2

United States Patent
Oh et al.

(10) Patent No.: US 8,169,132 B2
(45) Date of Patent: May 1, 2012

(54) ORGANIC LIGHT EMITTING DIODE DISPLAY DEVICE AND METHOD OF MANUFACTURING THE SAME

(75) Inventors: Min-Ho Oh, Yongin (KR); Yoon-Hyeung Cho, Yongin (KR); Byoung-Duk Lee, Yongin (KR); So-Young Lee, Yongin (KR); Sun-Young Lee, Yongin (KR); Jong-Hyuk Lee, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 198 days.

(21) Appl. No.: 12/759,500

(22) Filed: Apr. 13, 2010

(65) Prior Publication Data
US 2011/0140163 A1 Jun. 16, 2011

(30) Foreign Application Priority Data
Dec. 10, 2009 (KR) .................. 10-2009-0122533

(51) Int. Cl.
*H01J 1/62* (2006.01)
(52) U.S. Cl. ........ 313/489; 313/493; 313/512; 257/100; 257/E33.059; 438/26
(58) Field of Classification Search .................. 257/100, 257/E33.059, E33.06; 438/26, 38; 313/489, 313/493, 512
See application file for complete search history.

(56) References Cited

U.S. PATENT DOCUMENTS

| 8,003,999 B2* | 8/2011 | Cho et al. ................ 257/98 |
| 2011/0121270 A1* | 5/2011 | Kim et al. ................ 257/40 |
| 2011/0147789 A1* | 6/2011 | Lee et al. ................ 257/100 |

FOREIGN PATENT DOCUMENTS

| JP | 2002-117973 (A) | 4/2002 |
| JP | 2002-231443 (A) | 8/2002 |
| JP | 2003-282237 (A) | 3/2003 |

OTHER PUBLICATIONS

Korean Registration Determination Certificate dated Sep. 9, 2011 for Korean Patent Application No. KR 10-2009-0122533 which corresponds to captioned U.S. Appl. No. 12/759,500.
Korean Office Action dated Feb. 8, 2011 for Korean Patent Application No. KR 10-2009-0122533 which corresponds to the captioned application.

* cited by examiner

*Primary Examiner* — Minh-Loan T Tran
(74) *Attorney, Agent, or Firm* — Knobbe, Martens, Olson & Bear LLP

(57) ABSTRACT

An organic light emitting diode (OLED) display device and a method of manufacturing the same is disclosed. In one embodiment, the OLED device includes a substrate; a display unit formed on a display area of the substrate; and an encapsulating film covering i) the display unit and ii) a non-display area surrounding the display area, wherein the density and thickness of the encapsulating film increase in a direction from a center portion of the encapsulating film to an edge portion of the encapsulating film.

20 Claims, 5 Drawing Sheets

ORGANIC LIGHT EMITTING DIODE DISPLAY DEVICE AND METHOD OF MANUFACTURING THE SAME

CROSS-REFERENCE TO RELATED APPLICATIONS

This application claims the benefit of Korean Patent Application No. 10-2009-0122533, filed on Dec. 10, 2009, in the Korean Intellectual Property Office, the disclosure of which is incorporated herein in its entirety by reference.

BACKGROUND

1. Field

The present invention relates to a an organic light emitting diode (OLED) display device and a method of manufacturing the OLED display device, and more particularly, to an OLED display device improving a side waterproof property and a method of manufacturing the OLED display device.

2. Description of the Related Technology

An organic light emitting diode (OLED) includes an organic light emitting layer interposed two electrodes. The OLED is self-emissive, and may be used in a variety of applications, for example, as a thin and bendable display.

SUMMARY OF CERTAIN INVENTIVE ASPECTS

One aspect of the present invention is a film encapsulating structure and a deposition method to improve a side waterproof property of an organic light emitting diode (OLED) display device.

Another aspect is an OLED display device including a substrate, a display unit formed on the substrate, and an encapsulating film covering the display unit and a non-display area around the display unit, a density and a thickness of the encapsulating film increasing in a direction from a center portion of the encapsulating film to an edge portion of the encapsulating film.

The encapsulating film may be formed by a temperature gradient formed on the substrate. The temperature gradient may be formed by heating the non-light emitting area using a mask including a hot wire. The encapsulating film may be formed of one or more layers of one of an inorganic film and an organic film, or formed by alternating the inorganic film and the organic film.

The inorganic film may include one or more materials selected from among SiNx, SiOx, AlOx, SiCxNy, SiOxNy, amorphous carbon, InOx, and YbOx. The encapsulating film may be formed by one selected from among a sputter, a thermal evaporator, chemical vapor deposition (CVD), plasma enhanced chemical vapor deposition (PECVD), ion beam assisted deposition (IBAD), and atomic layer deposition (ALD).

Another aspect is a method of manufacturing an OLED display device, the method including providing a substrate, forming a display unit on the substrate, and forming an encapsulating film covering the display unit and a non-display area around the display unit, a density and a thickness of the encapsulating film increasing in a direction from a center portion of the encapsulating film to an edge portion of the encapsulating film.

The forming of the encapsulating film may include forming a temperature gradient on the substrate and applying an encapsulating film material to the substrate where the temperature gradient is formed. The forming of the temperature gradient may include placing a mask comprising a hot wire on the substrate and heating the non-light emitting area by heating the hot wire.

An opening of the mask may have a size to cover the display unit and a part of the non-light emitting area. The forming of the encapsulating film may include stacking one of an inorganic layer and an organic layer into one or more layers or alternately stacking the inorganic layer and the organic layer.

Another aspect is an organic light emitting diode (OLED) display device comprising: a substrate; a display unit formed on a display area of the substrate; and an encapsulating film covering i) the display unit and ii) a non-display area surrounding the display area, wherein the density and thickness of the encapsulating film increase in a direction from a center portion of the encapsulating film to an edge portion of the encapsulating film.

In the above device, the density and thickness of the encapsulating film in the non-display area are greater than that of the encapsulating film in the display area. In the above device, the density and thickness of the encapsulating film increase significantly in the border region between the display area and non-display area. In the above device, the encapsulating film is formed of at least one of an inorganic film and an organic film, or formed by alternating the inorganic film and the organic film. In the above device, the inorganic film is formed of at least one of the following: SiNx, SiOx, AlOx, SiCxNy, SiOxNy, amorphous carbon, InOx, and YbOx. In the above device, the encapsulating film comprises at least three layers which alternate an inorganic layer and an organic layer.

Another aspect is a method of manufacturing an organic light emitting diode (OLED) display device, the method comprising: providing a substrate; forming a display unit on a display area of the substrate; and forming an encapsulating film so as to cover i) the display unit and ii) a non-display area surrounding the display area, wherein the density and thickness of the encapsulating film increase in a direction from a center portion of the encapsulating film to an edge portion of the encapsulating film.

In the above method, the forming of the encapsulating film comprises: forming a temperature gradient on the substrate; and applying an encapsulating film material to the substrate where the temperature gradient is formed. In the above method, the forming of the temperature gradient comprises: placing a mask comprising a hot wire on the substrate; and heating the hot wire so as to heat the non-display area.

In the above method, a plurality of openings are defined in the mask, wherein at least one of the openings has a size to cover the display unit and a portion of the non-display area. In the above method, the forming of the encapsulating film comprises: stacking at least one of an inorganic layer and an organic layer. In the above method, the forming of the encapsulating film comprises alternately stacking an inorganic layer and an organic layer. In the above method, the inorganic layer is formed of at least one of the following: SiNx, SiOx, AlOx, SiCxNy, SiOxNy, amorphous carbon, InOx, and YbOx. In the above method, the encapsulating film is formed by at least one of the following: a sputter, a thermal evaporator, chemical vapor deposition (CVD), plasma enhanced chemical vapor deposition (PECVD), ion beam assisted deposition (IBAD), and atomic layer deposition (ALD).

Another aspect is an organic light emitting diode (OLED) display device comprising: a substrate; a display area in which at least one OLED is formed; a non-display area surrounding the display area; and an encapsulating film substantially completely covering the display area and covering at least part of the non-display area, wherein at least one of the density and thickness of the encapsulating film in the covered non-display area is greater than that of the encapsulating film in the display area.

In the above device, at least one of the density and thickness of the encapsulating film increases in a direction from a center portion of the encapsulating film to an edge portion of the encapsulating film, and wherein a majority of the edge portion is formed in the covered non-display area. In the above method, the thickness of the encapsulating film rapidly increases in the border region between the display area and non-display area. In the above method, the encapsulating film comprises a plurality of layers. In the above method, the plurality of layers comprise at least one inorganic layer and at leas one organic layer. In the above method, the plurality of layers include at least three layers which alternate an inorganic layer and an organic layer.

DETAILED DESCRIPTION OF CERTAIN INVENTIVE EMBODIMENTS

Figure 1:
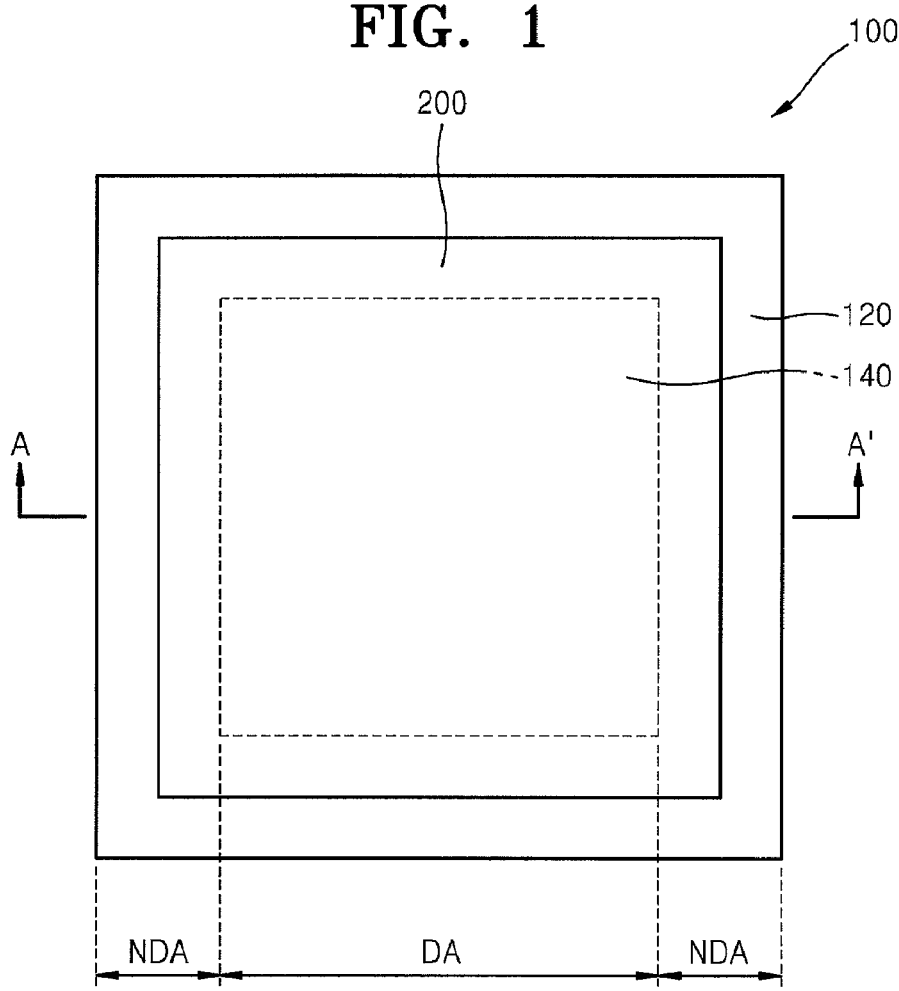
FIG. 1 is a plane view schematically illustrating an organic light emitting diode (OLED) display device according to an embodiment of the present invention.

An OLED is generally prone to a sharp degradation in performance after being exposed to moisture and oxygen introduced from an ambient environment. In this context, the formed OLED is sealed using a can or a glass substrate. Generally, a polymer material such as UV- or heat-curable epoxy or acryl is used for a sealant. However, due to the low waterproof performance of the polymer material, some characteristics, such as luminance, of the OLED degrade under the influence of moisture and oxygen introduced to the OLED over time, reducing the lifespan of the OLED. To solve this problem, a moisture absorbent is provided in a display device so that any moisture that is transferred past the sealant does not affect the OLED. This scheme, however, makes a manufacturing process complex and increases the weight and volume of the display device.

To address this problem, a film encapsulating technique has been proposed which encapsulates a display device by covering it with a protective film. Since a film encapsulating material used in the film encapsulating technique is directly related to the lifespan of an OLED, moisture permeability, adhesion with OLED materials, and thermal expansion coefficient relative to temperature need to be adjusted properly. In particular, moisture permeability exerts a significant influence on the lifespan of the OLED and thus is considered an important factor. Moisture permeation through the film encapsulating material includes permeation in substantially perpendicular to a film surface and side permeation through a device cross section, that is, a non-light emitting region.

A conventional film encapsulating material can effectively prevent permeation of moisture or oxygen in substantially perpendicular to a substrate, but the permeation occurs along an interface of an encapsulating film from the end of the encapsulating film in substantially parallel to the substrate.

Hereinafter, an exemplary embodiment of the present invention will be described in detail with reference to the accompanying drawings. Throughout the drawings, the thicknesses of layers or regions may be exaggerated for clarity and like reference numerals refer to like elements. When a portion "includes" a component, this means that other components are not excluded but can be further included unless otherwise specifically described.

Figure 2:
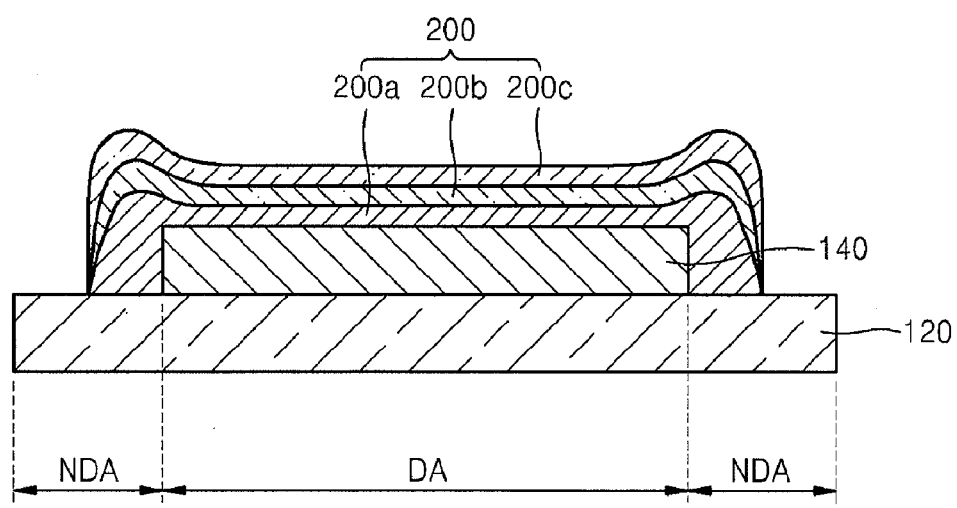
FIG. 2 is a cross-sectional view taken along a line A-A' of FIG. 1.
Figure 3:
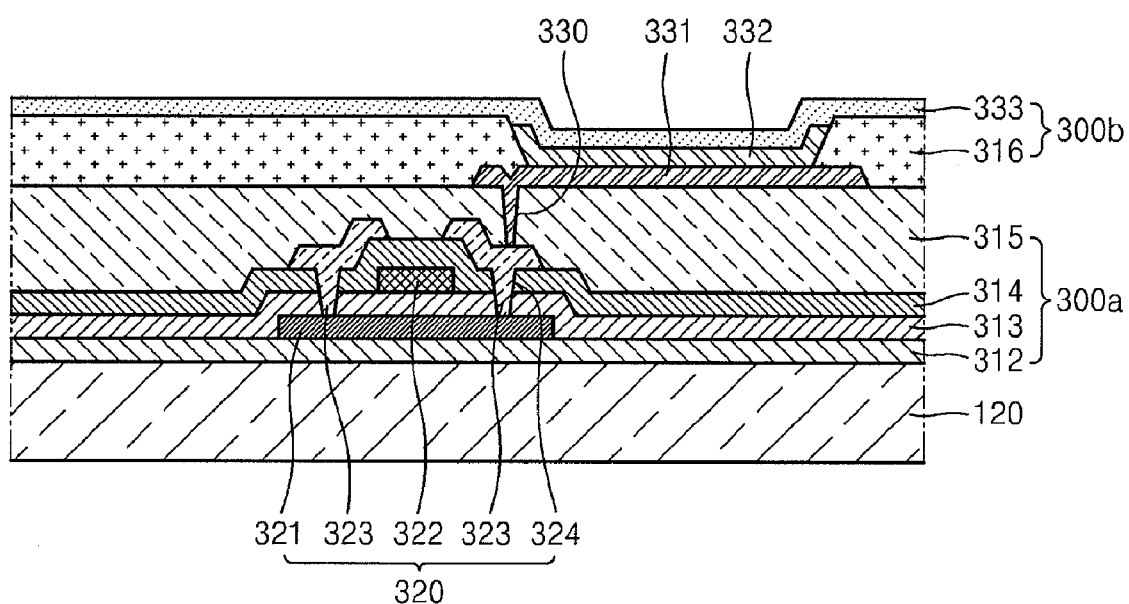
FIG. 3 is a partial-enlarged cross-sectional view of a display unit shown in FIG. 1.

FIG. 1 is a plane view schematically illustrating an organic light emitting diode (OLED) display device according to an embodiment of the present invention, FIG. 2 is a cross-sectional view taken along a line A-A' of FIG. 1, and FIG. 3 is a partial-enlarged cross-sectional view of a display unit shown in FIG. 1.

Referring to FIGS. 1 and 2, an OLED display device 100 includes a substrate 120 and an encapsulating film 200 which covers a display unit 140 provided on the substrate 120. The substrate 120 may be a transparent glass substrate having, for example, $SiO_2$ as its main component, or may use various materials such as plastic or metal. The display unit 140 provided on the substrate 120 may include an organic thin film transistor (OTFT) layer 300a and a pixel unit 300b. On a top surface of the substrate 120 may be formed an insulating layer 312, such as a barrier layer and/or a buffer layer, for preventing the spread of impurity ions and the permeation of moisture or external air and for planarizing the surface.

A TFT 320 is formed on the insulating layer 312 as a driving circuit. In the current embodiment, the TFT 320 is illustrated as being of a top gate type by way of example. However, the TFT 320 may be of another type. An active layer 321 of the TFT 320 may be formed of a semiconductor material on the insulating layer 312, and a gate insulating layer 313 is formed to cover the active layer 321. The active layer 321 may be formed of an inorganic semiconductor material such as silicon or poly silicon, or an organic semiconductor material, and includes a source region, a drain region, and a channel region therebetween.

A gate electrode 322 is provided on the gate insulating layer 313, and an interlayer insulating film 314 is formed to cover the gate electrode 322. Source/drain electrodes 323 are provided on the interlayer insulating film 314, and a planarizing film 315 is provided to cover the source/drain electrodes 323. However, the TFT 320 is not limited to the above-described stack structure and may have various structures. For example, some of the above elements may be omitted, additional elements being added, or the stacking order may change depending on the embodiment. This applies to other disclosed embodiments.

On the planarizing film 315 is formed an electrode of an OLED, a first electrode 331 which is electrically connected to at least one of the source and drain electrodes 323 through a contact hole 330. A second OLED electrode 333 is provided on the first electrode 331 to face the first electrode 331. The first electrode 331 may function as an anode electrode, and the second electrode 333 may function as a cathode electrode. However, the polarities of the first electrode 331 and the second electrode 333 may be interchanged with each other.

The first electrode 331 may be a transparent electrode or a reflective electrode. In case of being a transparent electrode, the first electrode 331 may include indium tin oxide (ITO), indium zinc oxide (IZO), zinc oxide (ZnO), or indium oxide ($In_2O_3$); in case of being a reflective electrode, the first electrode 331 may include a reflective film formed of, for example, Ag, Mg, Al, Pt, Pd, Au, Ni, Nd, Ir, Cr, or a combination thereof, and a transparent film formed of, for example, ITO, IZO, ZnO, or $In_2O_3$. The second electrode 333 may also be a transparent electrode or a reflective electrode. In case of being a transparent electrode, the second electrode 333 may include a film formed by depositing, for example, Li, Ca, LiF/Ca, LiF/Al, Al, Mg, or a combination thereof toward an intermediate layer, and an auxiliary electrode or bus electrode line formed of a transparent conductive material, such as ITO, IZO, ZnO, or $In_2O_3$ on the film. In case of being a reflective electrode, the second electrode 333 may be formed of, for example, Li, Ca, LiF/Ca, LiF/Al, Al, Mg, and a combination thereof.

When the substrate 120 includes the TFT 320 as mentioned above, the first electrode 331 patterned for each sub-pixel is electrically connected to the TFT 320 for each sub-pixel. In this case, the second electrode 333 may be formed as a common electrode connected to all sub-pixels. If the substrate 120 does not include the TFT 320 for each sub-pixel, the first electrode 330 and the second electrode 333 may be patterned as a stripe to intersect each other, thus being driven in a passive matrix manner.

An organic film layer 332 is interposed between the first electrode 331 and the second electrode 333. The organic film layer 332 may be formed of a low-molecular or high-molecular organic material. When using a low-molecular organic material, the organic film layer 332 may be formed by stacking a hole injection layer (HIL), a hole transport layer (HTL), an emission layer (EML), an electron transport layer (ETL), or an electron injection layer (EIL) alone or in combination thereof. Various organic materials for such a purpose can be used, including, but not limited to, copper phthalocyanine (CuPc), N, N'-Di(naphthalene -1-yl)-N, N'-diphenyl-benzidine (NPB), tris-8-hydroxyquinoline aluminum (Alq3), and the like. These low-molecular organic materials may be produced by vapor deposition using masks. When using a high-molecular organic material, the organic film layer 332 may include an HTL and an EML, in which polyethylenedioxythiophene (PEDOT) is used for the HTL and a high-molecular organic material, such as of a poly-phenylenevinylene (PPV) family and a polyfluorene family, is used as the EML.

An encapsulating film 200 is provided on the display unit 140 to cover the display unit 140. As mentioned previously, an OLED of the display unit 140 is prone to degradation by an external factor such as moisture or oxygen, and thus the encapsulating film 200 prevents permeation of oxygen or moisture into the display unit 140. The encapsulating film 200 may be formed of one or more layers of one of an inorganic layer and an organic layer, or formed by alternating the inorganic layer and the organic layer. Although a multi-layered film including three layers 200a, 200b, and 200c is shown in FIG. 2, the encapsulating film 200 may be formed properly according to an optimal film thickness, for example, one layer, or three or more layers.

The inorganic film may include, but not limited to, SiNx, SiOx, AlOx, SiCxNy, SiOxNy, amorphous carbon, InOx, YbOx, and the like. The organic film may include, but not limited to, parylene(poly-p-xylylene) (PPX), poly-2-chloro-p-zylylene (PCPX), poly[2-methoxy-r-(2' ethyhexylloxy)-1,4-phenylene vinylene], and the like. When an organic light emitting display is of a top emission type, the inorganic film and the organic film may be made of a material having high transparency.

The encapsulating film 200 may be formed using a sputter, a thermal evaporator, chemical vapor deposition (CVD), plasma enhanced chemical vapor deposition (PECVD), ion beam assisted deposition (IBAD), atomic layer deposition (ALD), or the like.

The encapsulating film 200 covers the display unit 140, which is a display area (DA), and some parts of a non-display area (NDA) around the display unit 140. In one embodiment, as shown in FIG. 2, the encapsulating film 200 is formed such that its thickness and density increase in a direction from its center portion toward its edge portion. In another embodiment, at least one of the thickness and density of the encapsulating film 200 increases in a direction from its center portion toward its edge portion. In another embodiment, at least one of the thickness and density of the encapsulating film 200 is greater in an edge portion thereof than a non-edge portion (including center portion).

Generally, by deposition, a thin film having uniform thickness and characteristics can be obtained. Variable which much affect moisture permeation to the thin film are the density, thickness, and adhesive strength of the thin film. Even if moisture coming substantially perpendicularly to the DA can be blocked, moisture introduced from a side may not be blocked. Therefore, in at least one embodiment, the encapsulating film 200 is formed such that its density and thickness increase in the direction from its center portion toward its edge portion.

A deposition rate varies with a temperature of a substrate, and the deposition rate increases as the temperature of the substrate increases. Accordingly, in one embodiment, to make density and thickness different for different areas of the encapsulating film 200, when the layers 200a, 200b, and 200c of the encapsulating film 200 are stacked, different substrate temperatures are set for the DA of the substrate 120 where the display unit 140 is positioned and the NDA around the display unit 140. Therefore, a temperature gradient is formed across the substrate 120 such that the substrate temperature of the NDA is higher than that of the DA. To form the temperature gradient on the substrate 120, one embodiment of the present invention may include a heater in a mask used to stack an encapsulating film material. The mask will be later described in more detail.

Generally, an encapsulating film forming process is performed after formation of an OLED. Consequently, a substrate temperature of a DA where the OLED is formed is maintained at a temperature being set not to change the physical properties of organic materials, and a substrate temperature of an NDA is set higher than that of the DA, such that the thickness and density of an encapsulating film formed in the NDA are larger than those of the encapsulating film formed in the DA.

The temperature and temperature gradient for the substrate 120 may change with the entire thickness, materials, and deposition method of the encapsulating film 200, and a density difference and a thickness difference between the center portion and the edge portion of the encapsulating film 200 may differ with the temperature gradient.

The temperature gradient of the substrate 120 is formed each time each layer of the encapsulating film 200 is deposited, and thus the density and thickness of the edge portion of the encapsulating film 200 are larger than those of the center portion of the encapsulating film 200 (or non-edge portion including the center portion), thereby effectively reducing an influence of permeation of moisture through a side interface.

Figure 4A:
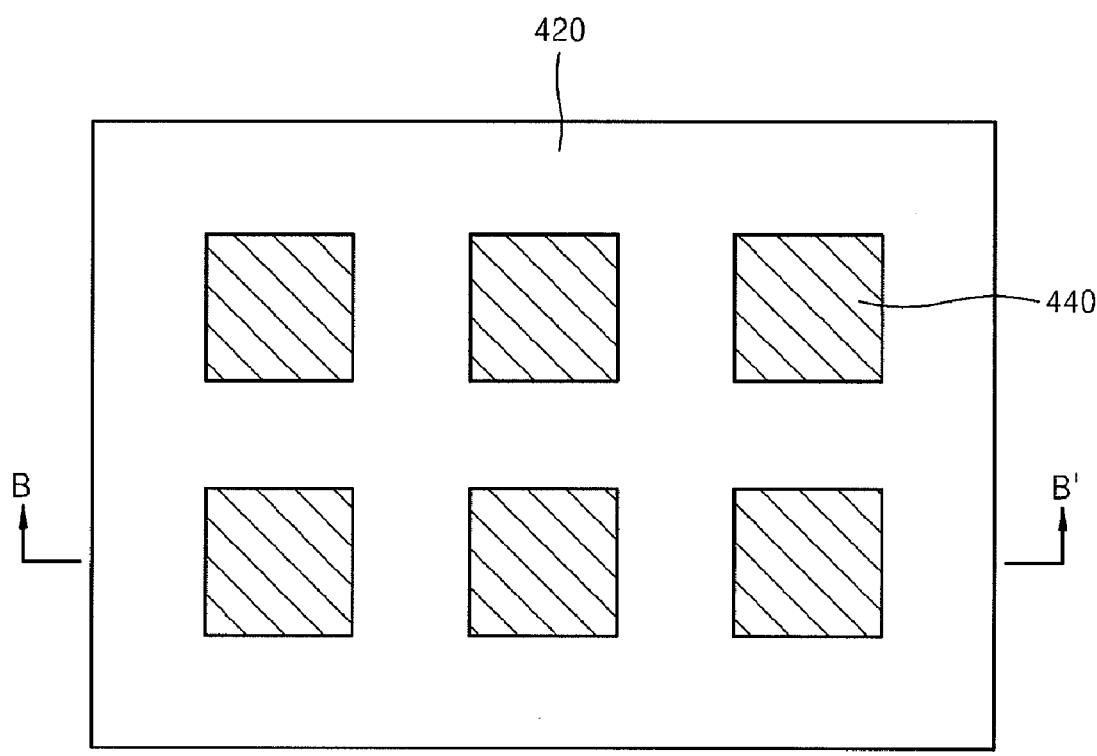
FIG. 4A is a view for schematically explaining a process of forming display units in a process of forming an encapsulating film on a substrate according to an embodiment of the present invention.
Figure 4B:
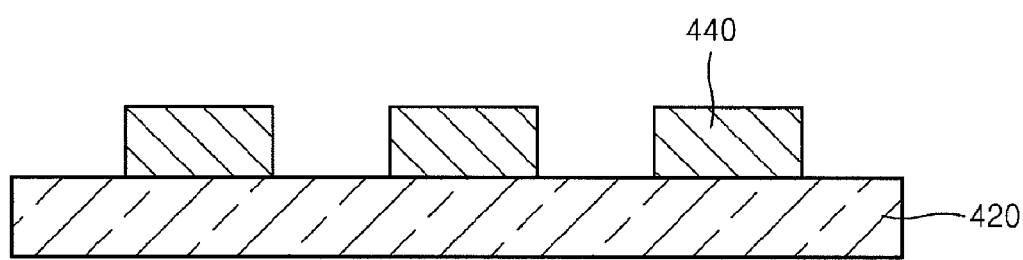
FIG. 4B is a cross-sectional view taken along a line B-B' of FIG. 1.

FIG. 4A is a view for schematically explaining a process of forming a display unit in a process of forming an encapsulating film on a substrate according to an embodiment of the present invention, and FIG. 4B is a cross-sectional view taken along a line B-B' of FIG. 4A.

Referring to FIGS. 4A and 4B, a plurality of panel regions are provided on a substrate 420 and a plurality of display units 440 are formed to include OLEDs in the respective panel regions. Each of the display units 440 includes a plurality of pixels, each of which includes at least one OLED. Each OLED may be classified into an active matrix (AM) OLED and a passive matrix (PM) OLED according to whether light emission thereof is controlled using a TFT electrically connected to the OLED. The OLED display device according to the current embodiment can be applied to both an AM OLED and a PM OLED. Although six panel regions are provided on the substrate 420 in FIG. 4A, the number of panel regions is not limited to six. After the plurality of display units 440 are formed spaced apart from each other on the substrate 420, an encapsulating film is formed to cover the display units 440.

Figure 5:
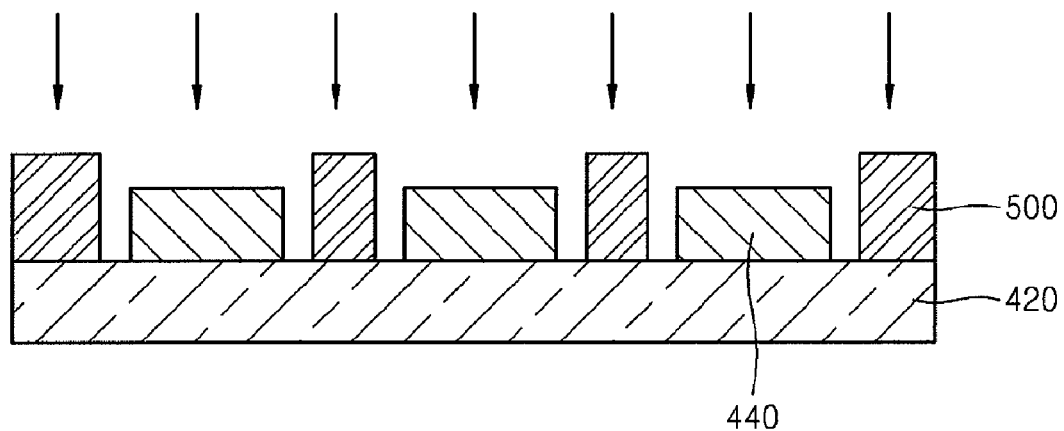
FIG. 5 is a view for schematically explaining a process of forming an encapsulating film on a substrate where display units are formed according to an embodiment of the present invention.
Figure 6:
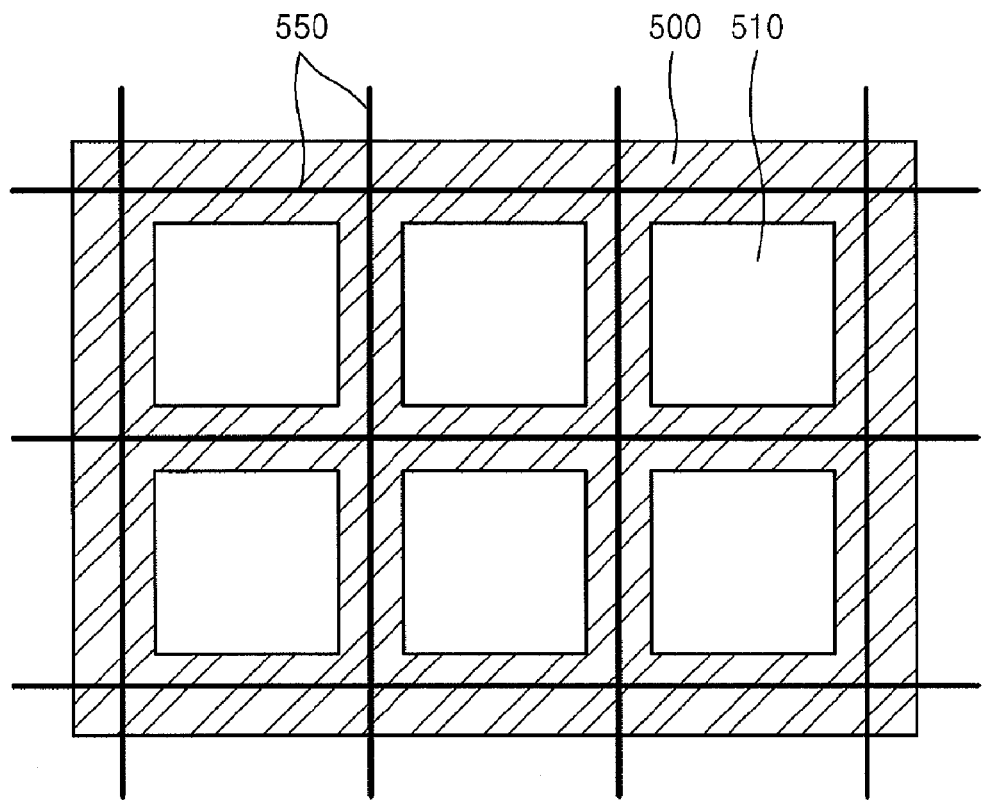
FIGS. 6 and 7 schematically illustrate examples of a mask that can be used in a process of forming an encapsulating film.
Figure 7:
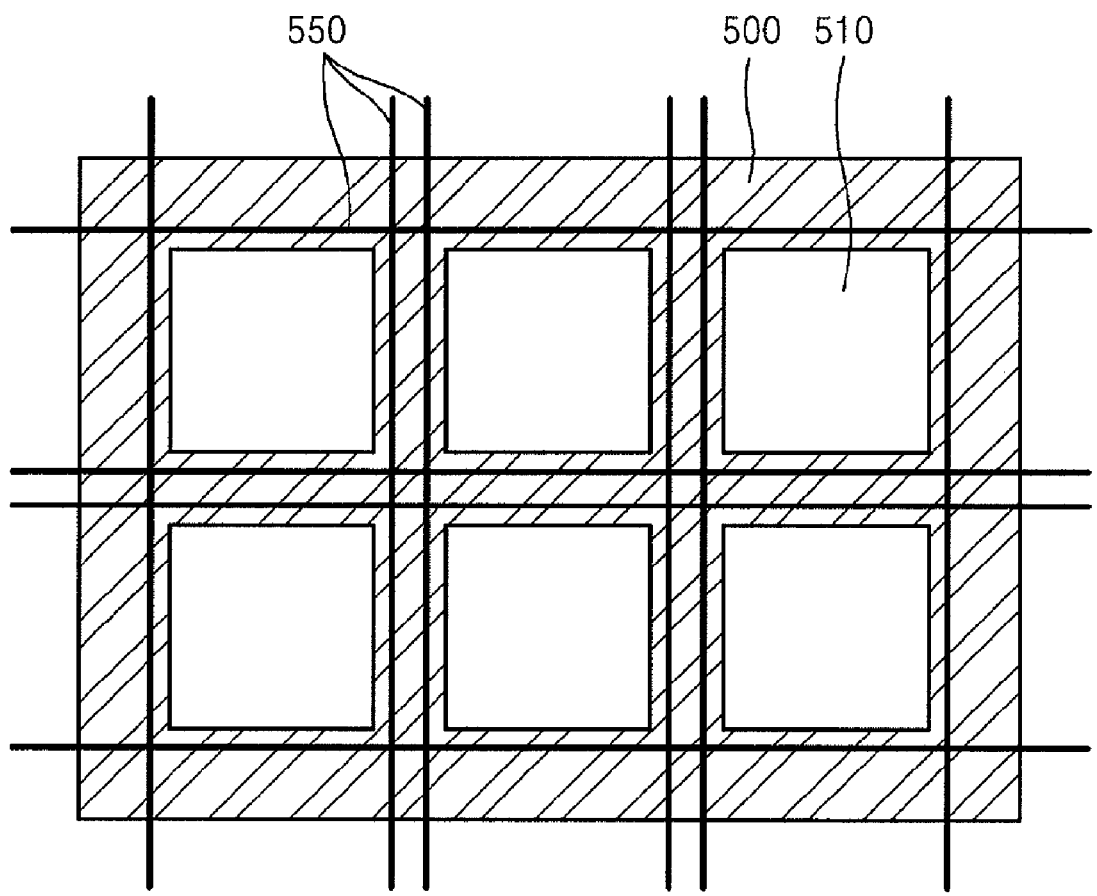

FIG. 5 is a view for schematically explaining a process of forming an encapsulating film on a substrate where display units are formed according to an embodiment of the present invention. FIGS. 6 and 7 schematically illustrate examples of a mask that can be used in a process of forming an encapsulating film.

Referring to FIG. 5, a mask 500 is placed on the substrate 420 where the display units 440 are formed. The mask 500 is positioned such that its openings reside over the display units 440 and vicinities thereof and its shielding portion resides between the display units 440 on the substrate 420.

After the mask 500 is aligned on the substrate 420, a material for forming an encapsulating film, or an encapsulating film material, is deposited in a direction from a deposition source as indicated by arrows shown in FIG. 5. The encapsulating film material may be an inorganic material including, but not limited to, SiNx, SiOx, AlOx, SiCxNy, SiOxNy, amorphous carbon, InOx, YbOx, and the like, and may additionally include an organic material such as resin. The encapsulating film material may be an organic material including, but not limited to, parylene(poly-p-xylylene) (PPX), poly-2-chloro-p-zylylene (PCPX), poly[2-methoxy-r-(2' ethyhexyl-loxy)-1,4-phenylene vinylene], and the like. When the encapsulating film has an inorganic film or a multi-layered structure where an inorganic film and an organic film are alternated, the mask 500 is aligned every film formation for deposition.

Referring to FIGS. 6 and 7, the mask 500 includes a plurality of openings 510 corresponding to the display units 440 and vicinities thereof and a shielding portion between the openings 510. A deposition material may be deposited on the substrate 420 through the openings 510. In one embodiment, each opening 510 or at least one opening is formed to have a size larger than that of each display unit 440 to cover each display unit 440 and some parts of an NDA around the display unit 440. Therefore, the encapsulating film material may be deposited across the display units 440, which are DAs, and some parts of NDAs around the display units 440.

When a thin film is formed by vapor deposition, the thickness and characteristics of the film become uniform across the entire area before deposited. Even when the same material is used across the entire area of the film, a deposition rate and a film density show much difference according to a substrate temperature. Therefore, to perform deposition such that film characteristics, as a deposition variable, differ with regions, a mask used in deposition includes a heater in one embodiment of the present invention.

The mask 500 includes a heater, e.g., a hot wire 550, in the shielding portion thereof, that is, between the openings 510 and outside the openings 510. One hot wire 550 may be provided between the openings 510 as shown in FIG. 6, or one or more hot wires 550, for example, two hot wires 550 may be provided between the openings 510 as shown in FIG. 7. The hot wire 550 may be positioned adjacent to the outline of the opening 510 to heat an NDA of the substrate 420.

If the hot wire 550 of the mask 500 is heated during deposition of the encapsulating film material, a portion of the substrate 420, which contacts or is adjacent to the mask 500 including the hot wire 550, is heated. Therefore, on the substrate 420 may be formed a temperature gradient where temperature increases in a direction from a center potion of the display unit 440 to an edge portion of the display unit 440. Since higher substrate temperature means higher deposition rate, a deposition rate around the outline of the opening 510 is higher than that in the center of the opening 510 because a substrate temperature around the outline of the opening 510 is higher than that in the center of the opening 510. As a result, the encapsulating film may have larger thickness and density in the edge portion than those in the center portion (or non-edge portion including the center portion).

The temperature and temperature gradient for each area of the substrate 420 may be set differently according to the entire thickness, materials, and deposition method of the encapsulating film. For example, in case of using PECVD for formation of the encapsulating film, a substrate temperature of a DA where the display unit 440 is positioned may be maintained below about 100° C., and a substrate temperature of an NDA may be maintained at about 140° C., which is higher than that of the DA, by heating the hot wire 550 of the mask 500. Within a range which does not affect an organic device of a DA, the substrate temperature of the NDA heated by the hot wire 550 of the mask 500 may be set higher than about 140° C.

The encapsulating film may be formed of at least one of an inorganic layer and an organic layer, or formed by alternating the inorganic layer and the organic layer. When the encapsulating film has a multi-layered structure, a bottom layer, and subsequent layers are sequentially formed in the aforementioned manner. A temperature being set on the substrate 420 and a temperature gradient formed on the substrate 420 may differ with a material used in each layer, and a density difference and a thickness difference between a center portion and an edge portion of the formed encapsulating film may also vary with the temperature gradient.

As described above, the encapsulating film according to at least one embodiment of the present invention is formed such that its density and thickness increase in a direction from its center portion to its edge portion, thereby effectively preventing permeation of moisture or oxygen through a side and thus prolonging the lifespan of an OLED display device.

While the present invention has been particularly shown and described with reference to an exemplary embodiment thereof, it will be understood by those of ordinary skill in the art that various changes in form and details may be made therein without departing from the spirit and scope of the present invention as defined by the following claims.

What is claimed is:

1. An organic light emitting diode (OLED) display device comprising:
   a substrate;
   a display unit formed on a display area of the substrate; and
   an encapsulating film covering i) the display unit and ii) a non-display area surrounding the display area, wherein the density and thickness of the encapsulating film increase in a direction from a center portion of the encapsulating film to an edge portion of the encapsulating film.

2. The OLED display device of claim 1, wherein the density and thickness of the encapsulating film in the non-display area are greater than that of the encapsulating film in the display area.

3. The OLED display device of claim 1, wherein the density and thickness of the encapsulating film increase significantly in the border region between the display area and non-display area.

4. The OLED display device of claim 1, wherein the encapsulating film is formed of at least one of an inorganic film and an organic film, or formed by alternating the inorganic film and the organic film.

5. The OLED display device of claim 4, wherein the inorganic film is formed of at least one of the following: SiNx, SiOx, AlOx, SiCxNy, SiOxNy, amorphous carbon, InOx, and YbOx.

6. The OLED display device of claim 1, wherein the encapsulating film comprises at least three layers which alternate an inorganic layer and an organic layer.

7. A method of manufacturing an organic light emitting diode (OLED) display device, the method comprising:
    providing a substrate;
    forming a display unit on a display area of the substrate; and
    forming an encapsulating film so as to cover i) the display unit and ii) a non-display area surrounding the display area, wherein the density and thickness of the encapsulating film increase in a direction from a center portion of the encapsulating film to an edge portion of the encapsulating film.

8. The method of claim 7, wherein the forming of the encapsulating film comprises:
    forming a temperature gradient on the substrate; and
    applying an encapsulating film material to the substrate where the temperature gradient is formed.

9. The method of claim 8, wherein the forming of the temperature gradient comprises:
    placing a mask comprising a hot wire on the substrate; and
    heating the hot wire so as to heat the non-display area.

10. The method of claim 9, wherein a plurality of openings are defined in the mask, wherein at least one of the openings has a size to cover the display unit and a portion of the non-display area.

11. The method of claim 7, wherein the forming of the encapsulating film comprises:
    stacking at least one of an inorganic layer and an organic layer.

12. The method of claim 7, wherein the forming of the encapsulating film comprises alternately stacking an inorganic layer and an organic layer.

13. The method of claim 7, wherein the inorganic layer is formed of at least one of the following: SiNx, SiOx, AlOx, SiCxNy, SiOxNy, amorphous carbon, InOx, and YbOx.

14. The method of claim 7, wherein the encapsulating film is formed by at least one of the following: a sputter, a thermal evaporator, chemical vapor deposition (CVD), plasma enhanced chemical vapor deposition (PECVD), ion beam assisted deposition (IBAD), and atomic layer deposition (ALD).

15. An organic light emitting diode (OLED) display device comprising:
    a substrate;
    a display area in which at least one OLED is formed;
    a non-display area surrounding the display area; and
    an encapsulating film substantially completely covering the display area and covering at least part of the non-display area, wherein at least one of the density and thickness of the encapsulating film in the covered non-display area is greater than that of the encapsulating film in the display area.

16. The OLED display device of claim 15, wherein at least one of the density and thickness of the encapsulating film increases in a direction from a center portion of the encapsulating film to an edge portion of the encapsulating film, and wherein a majority of the edge portion is formed in the covered non-display area.

17. The OLED display device of claim 15, wherein the thickness of the encapsulating film rapidly increases in the border region between the display area and non-display area.

18. The OLED display device of claim 15, wherein the encapsulating film comprises a plurality of layers.

19. The OLED display device of claim 18, wherein the plurality of layers comprise at least one inorganic layer and at least one organic layer.

20. The OLED display device of claim 18, wherein the plurality of layers include at least three layers which alternate an inorganic layer and an organic layer.

* * * * *